United States Patent
Michii et al.

(10) Patent No.: US 6,836,004 B2
(45) Date of Patent: Dec. 28, 2004

(54) LEAD FRAME, AND METHOD FOR MANUFACTURING SEMICONDUCTOR DEVICE AND METHOD FOR INSPECTING ELECTRICAL PROPERTIES OF SMALL DEVICE USING THE LEAD FRAME

(75) Inventors: Kazunari Michii, Tokyo (JP); Naoyuki Shinonaga, Nagano (JP); Shinji Semba, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 92 days.

(21) Appl. No.: 10/342,398

(22) Filed: Jan. 15, 2003

(65) Prior Publication Data
US 2004/0018663 A1 Jan. 29, 2004

(30) Foreign Application Priority Data

Jul. 26, 2002 (JP) ......................................... 2002-217694

(51) Int. Cl.[7] ............................................. H01L 23/495
(52) U.S. Cl. ...................... 257/670; 257/666; 257/667; 257/690; 257/696
(58) Field of Search ............................... 257/666, 670, 257/690, 696, 667

(56) References Cited

U.S. PATENT DOCUMENTS 5,539,251 A * 7/1996 Iverson et al. ............... 257/670
5,541,447 A * 7/1996 Maejima et al. ............. 257/669
5,703,396 A * 12/1997 Kurihara ...................... 257/692
5,710,064 A * 1/1998 Song et al. ................... 438/123
6,177,718 B1 * 1/2001 Kozono ........................ 257/666
6,444,905 B1 * 9/2002 Miyaki et al. ............... 174/52.4
6,608,369 B2 * 8/2003 Sone ............................ 257/676
6,627,976 B1 * 9/2003 Chung et al. ................. 257/666
6,642,082 B2 * 11/2003 Yamaguchi et al. ......... 438/112

FOREIGN PATENT DOCUMENTS

| JP | 6-132464 | 5/1994 |
| JP | 7-253450 | 10/1995 |
| JP | 9-129815 | 5/1997 |

* cited by examiner

*Primary Examiner*—Michael S. Lebentritt
*Assistant Examiner*—Douglas M Menz
(74) *Attorney, Agent, or Firm*—McDermott Will & Emery LLP

(57) ABSTRACT

A lead frame comprises a plurality of frame assemblies. Each framework assembly includes a framework, a suspension lead, a die pad, a plurality of inner leads and outer leads, a first tie bar and a second tie bar, and a lead support. The plurality of framework assemblies are disposed alongside of one another in a direction perpendicular to a direction in which the plurality of outer leads extend. A distance between close-set outer leads in each two neighboring frameworks is substantially n times a pitch of the plurality of outer leads in each framework, wherein n is an integer.

1 Claim, 9 Drawing Sheets

Fig. 10   *Related Art*
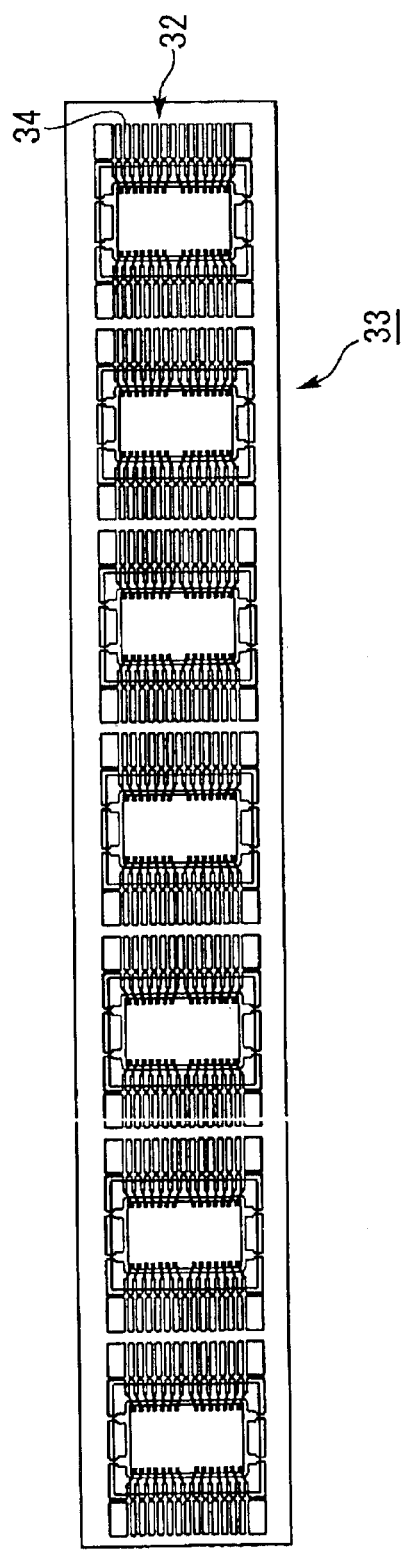

US 6,836,004 B2

LEAD FRAME, AND METHOD FOR MANUFACTURING SEMICONDUCTOR DEVICE AND METHOD FOR INSPECTING ELECTRICAL PROPERTIES OF SMALL DEVICE USING THE LEAD FRAME

BACKGROUND OF THE INVENTION

1. Field of the Invention

The present invention relates to a lead frame, and a method for producing a semiconductor device and a method for inspecting the electrical properties of a small device using the lead frame.

2. Background Art

Resin-sealed semiconductor devices using a lead frame are widely used as inexpensive small-pin IC packages, whose pin counts and package sizes vary greatly.

FIG. 9 is a perspective plan view of a device employing a conventional SOP (Small Outline Package) type package, the view showing how the IC chip is mounted on the lead frame and molded with resin. In the figure, reference numeral 22 denotes a package made up of a semiconductor chip molded with resin, and 23 denotes a lead frame having the package 22 mounted thereon forming a single unit. The lead frame 23 includes a die pad 24, leads 25, suspension leads 26, and tie bars 27. A semiconductor chip 28 is bonded onto the die pad 24 by means of die bonding. The leads 25 include inner leads 25a disposed within the package and outer leads 25b extending from the inner leads 25a to the outside of the package. The inner leads 25a are connected to electrode pads 29 on the semiconductor chip 28 through wires 30. On the other hand, the ends of the outer leads 25b extending from the inner leads 25a are connected to a framework 31. Furthermore, the suspension leads 26 are provided between the semiconductor chip 28 and the framework 31 such that they intersect the outer leads 25b and thereby function to, when the package 22 is molded with resin, prevent the resin from flowing to the outer leads 25b. The suspension leads 26 extend in parallel with the longitudinal direction of the die pad 24, and both of their ends are connected to the framework 31 so that the suspension leads 26 function to support the die pad 24.

Description will be made below of a method for manufacturing a semiconductor device using the lead frame shown in FIG. 9. First of all, the semiconductor chip 28 is mounted on the die pad 24 and connected to the inner leads 25a through the wires 30 using the wire bonding method. Subsequently, the die pad 24, the inner leads 25a, the semiconductor chip 28, and the wires 30 are sealed with resin using the transfer molding method to form the package 22. The actual lead frame has a structure in which, for example, a plurality of devices 32 are disposed alongside of one another in the longitudinal direction of a lead frame 33, as shown in FIG. 10. Each device 32 is arranged such that the longitudinal direction of outer leads 34 and that of the lead frame 33 are in parallel with each other. Then, in FIG. 9, the tie bars 27 and the tip of the outer leads 25b, and the suspension leads 26 are cut, and the outer leads 25b are bent in a predetermined shape, completing a resin-sealed semiconductor device. FIG. 11(a) is a plane view of a completed resin-sealed semiconductor device, while FIG. 11(b) is a side view.

Conventionally, the electrical properties of each individual semiconductor device cut off as described above is inspected independently by connecting an electrode terminal to each lead. However, this means that it is necessary to set each semiconductor device at a predetermined inspection position for measurement one at a time, which requires considerable time. In addition, since each semiconductor device is small and therefore difficult to handle, JAM is likely to occur due to dropping at the time of inspection or transfer of the device. Furthermore, it is necessary to prepare an inspecting aid(s) for each package size, incurring a cost.

The present invention has been devised in view of the above problems. It is, therefore, an object of the present invention to provide a lead frame with which electrical property inspection (of a each device) can be efficiently carried out, and a method for manufacturing a semiconductor device using the lead frame.

Another object of the present invention is to provide a method for efficiently inspecting the electrical properties of a small device.

Other objects and advantages of the present invention will become apparent from the following description.

SUMMARY OF THE INVENTION

According to one aspect of the present invention, a lead frame comprises a plurality of framework assemblies. Each framework assembly includes a framework, a suspension lead whose both ends are connected to said framework, a die pad which is supported by the suspension lead and on which a semiconductor chip is mounted, a plurality of inner leads whose front ends are connected to electrodes on the semiconductor chip through wires, a plurality of outer leads extending from back ends of the plurality of inner leads toward outside of the semiconductor chip, wherein front ends of the plurality of outer leads are connected to no other portions and leave in a free state, a first tie bar located near the plurality of inner leads across the plurality of outer leads, wherein both ends of the first tie bar are connected to the framework, a second tie bar located near the front ends of the plurality outer leads across the plurality of outer leads, wherein both ends of the second tie bar are connected to the framework, and a lead support protruding from the framework's surface facing to the front ends of the plurality of outer leads to the front ends of them and having a rectangular shape whose long sides are in parallel with a direction in which the plurality of outer leads are disposed alongside of one another and whose length is approximately equal to a length of space occupied by all of the plurality of outer leads. The plurality of framework assemblies are disposed alongside of one another in a direction perpendicular to a direction in which the plurality of outer leads extend. A distance between close-set outer leads of each two neighboring frameworks is substantially n times a pitch of the plurality of outer leads of each framework, wherein n is an integer.

According to another aspect of the present invention, in a method for manufacturing a semiconductor device, a lead frame is prepared. The lead frame comprises a plurality of framework assemblies. Each framework assembly includes a framework, a suspension lead whose both ends are connected to the framework, a die pad which is supported by the suspension lead and on which a semiconductor chip is mounted, a plurality of inner leads whose front ends are connected to electrodes on the semiconductor chip through wires, a plurality of outer leads extending from back ends of the plurality of inner leads toward outside of the semiconductor chip, wherein front ends of the plurality of outer leads are connected to no other portions and leave in a free state, a first tie bar located near the plurality of inner leads across the plurality of outer leads, wherein both ends of the first tie bar are connected to the framework, a second tie bar located near the front ends of the plurality outer leads across the plurality of outer leads, wherein both ends of the second tie bar are connected to the framework; and a lead support protruding from the framework's surface facing to the front ends of the plurality of outer leads to the front ends of them and having a rectangular shape whose long sides are in parallel with a direction in which the plurality of outer leads are disposed alongside of one another and whose length is approximately equal to a length of space occupied by all of the plurality of outer leads. The plurality of framework assemblies are disposed alongside of one another in a direction perpendicular to a direction in which the plurality of outer leads extend. A distance between close-set outer leads of each two neighboring frameworks is substantially n times a pitch of the plurality of outer leads of each framework, wherein n is an integer. Then, in the method for manufacturing the semiconductor device, the semiconductor chip is mounted on the die pad. Between the electrodes on the semiconductor chip and the plurality of inner leads through the wires are electrically connected. The semiconductor chip, the die pad, the wires, and the plurality of inner leads are sealed with resin to form a small device. The front ends of the plurality of outer leads and the lead support are sealed with resin. The first tie bar and the second tie bar are cut to electrically isolate each of the plurality of outer leads. An inspecting aid having a plurality of electrode terminals disposed alongside of one another at a pitch substantially 1/m times a pitch of the plurality of outer leads of each framework is used (where m is an integer). And the plurality of electrode terminals are connected to the plurality of outer leads to inspect electrical properties of the small device. The suspension lead is cut off. The lead support is separated from each framework. The plurality of outer leads are processed. The lead support is cut off.

According to other aspect of the present invention, in a method for inspecting electrical properties of a plurality of small devices which are formed by mounting a plurality of semiconductor chips on a common lead frame, connecting a plurality of leads to each semiconductor chip, and then sealing each semiconductor chip with resin; a inspecting aid having a plurality of electrode terminals disposed at equal intervals is disposed, such that a direction in which the plurality of leads are disposed alongside of one another is parallel to that in which said plurality of electrode terminals are disposed alongside of one another. The plurality of electrode terminals are connected to the plurality of leads, wherein the plurality of leads are disposed at a pitch substantially n times a pitch of the plurality of electrode terminals (where n is an integer).

Other and further objects, features and advantages of the invention will appear more fully from the following description.

BRIEF DESCRIPTION OF THE DRAWINGS

FIG. 10 is a plane view of a conventional lead frame.

DETAILED DESCRIPTION OF THE PREFERRED EMBODIMENTS

A preferred embodiment of the present invention will be described below in detail with reference to the accompanying drawings.

Figure 1:
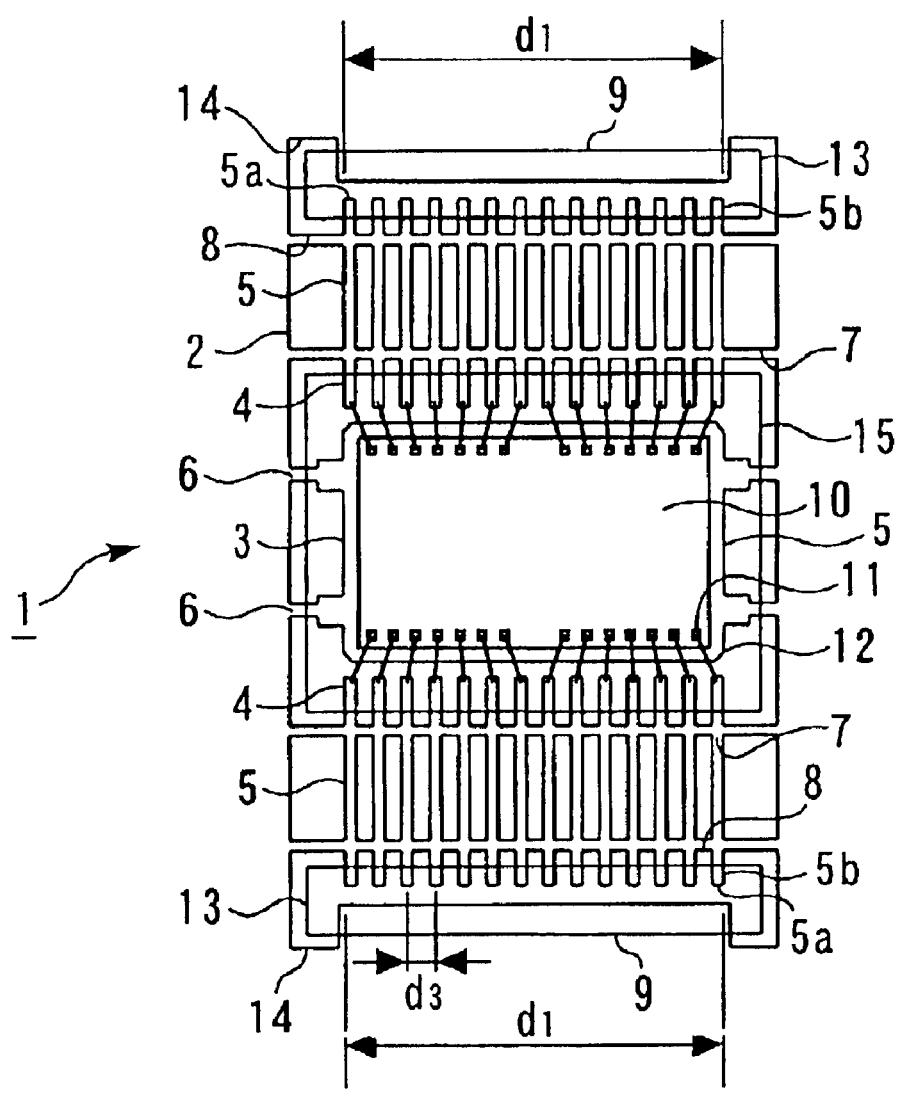
FIG. 1 is a perspective plane view of a semiconductor device using a lead frame according to the present invention.

FIG. 1 is a perspective plan view of a semiconductor device using a lead frame according to a preferred embodiment of the present invention. As shown in the figure, a lead frame 1 according to the present invention comprises a framework 2, a die pad 3, inner leads 4, outer leads 5, suspension leads 6, first tie bars 7, second tie bars 8, and lead supports 9 (the inner leads and the outer leads may be hereinafter collectively referred to as the leads). The die pad 3 is supported by the suspension leads 6 extending in parallel with the longitudinal direction of the die pad 3. Both ends of the suspension leads 6 are connected to the framework 2. One end of each inner lead 4 is connected through a wire 12 to an electrode pad 11 disposed on a semiconductor chip 10 mounted on the die pad 3. The other end of each inner lead 4, on the other hand, is connected to a respective outer lead 5. The outer leads 5 extend vertically (above and below) in FIG. 1.

The present invention is characterized in that the ends 5a of the outer leads are not connected to the framework 2, but they are left in a free state. In this state, since the ends 5a of the outer leads are not connected to any other portions, cutting the first and second tie bars can electrically isolate each outer lead, as described later.

The present invention is also characterized in that the lead supports 9 protruding from the framework 2 and the ends 5b of the outer leads are molded with an insulating resin 13 to support and fix each outer lead 5. The lead supports 9 protrude toward the ends 5a of the outer leads from a surface 14 facing the ends 5a of the outer leads. Furthermore, the lead supports 9 have a rectangular shape whose long sides are in parallel with the direction in which the outer leads are disposed alongside of one another. The length of the long sides of the lead supports 9 is preferably set approximately equal to the length of the space occupied by all outer leads, that is, the distance $d_1$ from the outer lead at one end to the outer lead at the other end. If the length of the long sides is too short, it is difficult for the lead supports 9 to fully support the outer leads. If the length is too long, on the other hand, the molding work is difficult because the distance between the lead supports 9 and the framework 2 becomes short. As for the short sides of the lead supports 9, if their length is too long, since the distance between the lead supports 9 and the ends 5a of the outer leads becomes short, a short circuit might occur between the outer leads. If the length is too short, on the other hand, it is difficult for the lead supports 9 to fully support the outer leads. Therefore, the length of the short sides of the lead supports 9 must be set to a certain intermediate value.

The present invention is further characterized in that the first and second tie bars are provided on the outer leads.

In FIG. 1, the first tie bars 7 are disposed near the inner leads 4 such that the first time bars 7 intersect the outer leads 5, as in the conventional arrangement. This can prevent a resin 15 from flowing to the outer leads 5 when the semiconductor chip 10, etc. are sealed with the resin 15, resulting in high-precision sealing. On the other hand, the second tie bars 8, which are newly provided by the present invention, are disposed near the ends 5b of the outer leads such that the second bars 8 intersect the outer leads 5. The width of the second tie bars 8 may be equal to that of the first tie bars 7. This arrangement of the second tie bars 8 can prevent the resin 13 from flowing to the outer leads 5 when the ends 5b of the outer leads and the lead supports 9 are molded with the resin 13. It should be noted that both ends of the first tie bars 7 and the second tie bars 8 are connected to the framework 2.

According to the present invention, the first tie bars 7 and the second tie bars 8 are cut after the sealing with the resin 13 and the resin 15. Since the ends 5b of the outer leads are not connected to the framework 2 and are left in a free state, cutting the first tie bars 7 and the second tie bars 8 can electrically isolate each outer lead 5.

Figure 2:
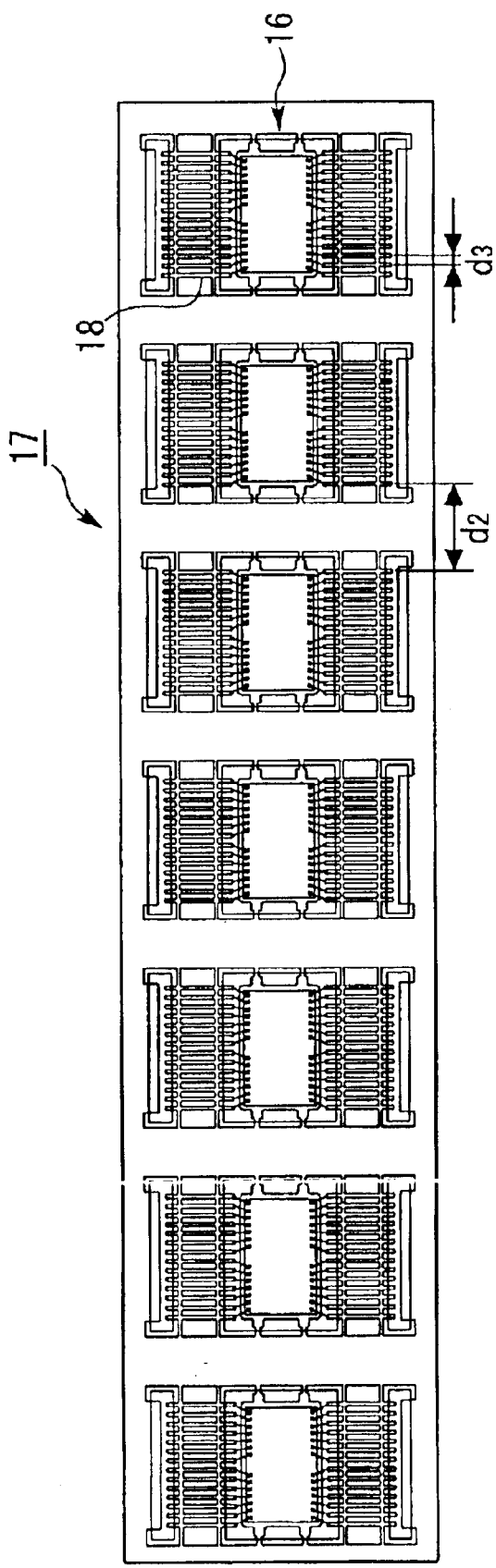
FIG. 2 is a plane view of a lead frame according to the present invention.

FIG. 2 is a general view of a lead frame according to the present invention. According to the present invention, a plurality of frameworks 16 are disposed alongside of one another in the longitudinal direction of a lead frame 17. Each framework 16 is aligned in a direction perpendicular to the direction in which outer leads 18 extend. Thus, the outer leads 18 of each device are disposed alongside of one another in an orderly manner in the longitudinal direction of the lead frame 17. Furthermore, the present invention is characterized in that each device is disposed such that the distance $d_2$ between the close-set outer leads of each two neighboring devices (the rightmost outer lead of the left device and the leftmost outer lead of the right device) is n times the pitch of the outer leads of each device, where n is an integer. For example, if the outer leads of each device are disposed at a pitch of 0.4 mm, the distance between the close-set outer leads of each two neighboring devices is set to (0.4×n) mm.

Figure 3:
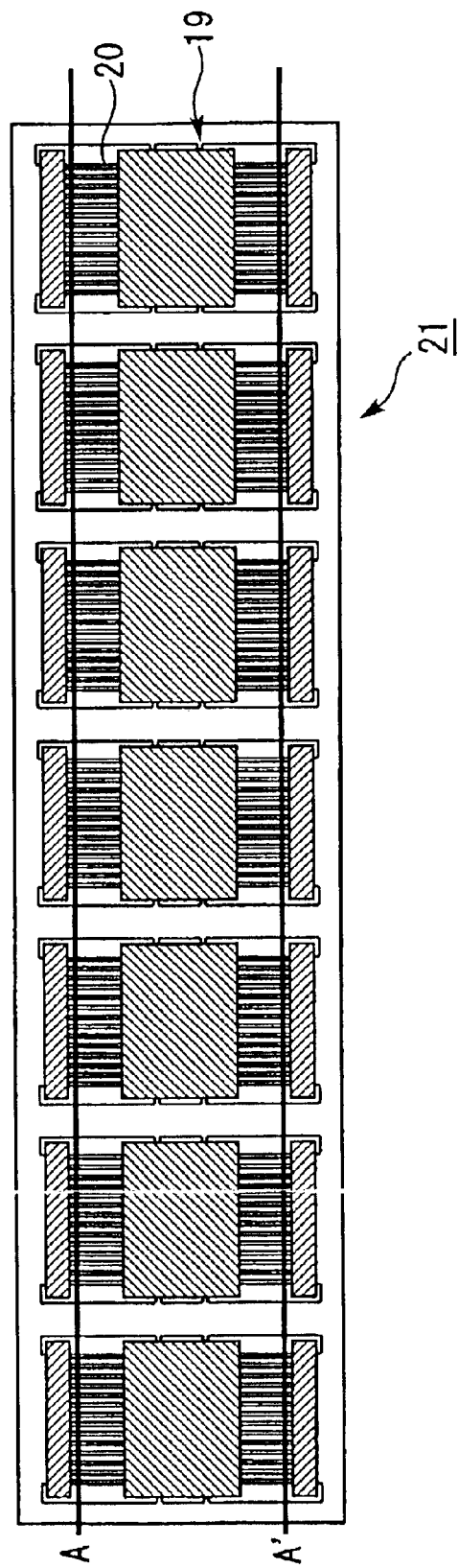
FIG. 3 shows a method for inspecting electrical properties according to the present invention.

In FIG. 3, line A and line A' indicate an inspecting aid provided with electrode terminals (not shown) for electrical property inspection. The pitch of the electrode terminals is equal to, for example, the pitch of the outer leads 20 of each device 19 to be inspected. That is, if the outer leads of each device are disposed at a pitch of 0.4 mm, then the electrode terminals are also disposed at a pitch of 0.4 mm. In this case, it is not necessary to remove the electrode terminals which have no corresponding outer leads (that is, those electrode terminals between the devices). All that need be done is to arrange the electrode terminals at a pitch of 0.4 mm along the entire line A and line A'. Since each device 19 is disposed such that the distance between the closest outer leads 20 of each two neighboring devices 19 is n times the pitch of the outer leads 20 of each device 19 (where n is an integer), no misalignment of the outer leads 20 of each device 19 with respect to the electrode terminals occurs. That is, it is possible to bring all the outer leads 20 of each device 19 into contact with the corresponding electrode terminals in a single operation. Furthermore, each device 19 can be inspected without removing it from the lead frame 17. The electrical properties of each device 19 can be inspected in a state in which the device is mounted on the lead frame 17 forming a single unit.

It should be noted that the same inspecting aid may be used to measure the electrical properties of a device whose outer leads are disposed at a pitch m times the pitch of the electrode terminals, where m is an integer. For example, an inspecting aid having electrode terminals at a pitch of 0.4 mm can be applied to devices whose outer leads are disposed at a pitch of not only 0.4 mm but also 0.8 mm. Therefore, the inspecting aid may not need to be changed to inspect devices having different pin counts, package sizes, and package widths.

With reference to FIGS. 1 to 7, description will be made below of a method for manufacturing a semiconductor device, in which a semiconductor chip is mounted on a lead frame according to the present invention.

First of all, a lead frame of the present invention is prepared. For example, as shown in FIG. 2, the lead frame 17 is punched out from a metal plate made of an alloy of Ni and Fe. In the lead frame 17, a plurality of patterns each having the shape shown in FIG. 1 are arranged in the longitudinal direction. Each pattern includes, as shown in FIG. 1, the framework 2, the suspension leads 6, the die pad 3, the inner leads 4, the outer leads 5, the first tie bars 7, the second tie bars 8, and the lead supports 9, which can be collectively formed as a unit. According to the present invention, as shown in FIG. 2, each pattern is arranged such that the longitudinal direction of the outer leads 18 is perpendicular to that of the lead frame 17, and the distance $d_2$ between the close-set outer leads 18 of each two neighboring patterns is n times the pitch of the outer leads 18 of each pattern, where n is an integer.

With reference to FIGS. 1 and 3 to 7, further description will be made below of the method for manufacturing a semiconductor device, in which a semiconductor chip is mounted on a lead frame according to the present invention. As shown in FIG. 1, the semiconductor chip 10 is bonded onto the die pad 3 by means of die bonding. Then, the electrode pads 11 formed on the surface of the semiconductor chip 10 are bonded to the inner leads 4 by means of wire bonding. Specifically, the electrode pads 11 and the inner leads 4 are connected by way of the wires 12. Thin wires of high-purity Au, for example, are used as the wires 12.

Subsequently, the semiconductor chip 10, the die pad 3, the wires 12, and the inner leads 4 are sealed with the resin 15 by use of the transfer molding method to form a package. Furthermore, the present invention characteristically molds the ends 5b of the outer leads and the lead supports 9 with the resin 13. The sealing with the resin 15 and the sealing with the resin 13 can be carried out at the same time. In addition, the resins 15 and 13 may be of the same type. For example, either epoxy resin or silicon resin may be used. Since the lead frame 1 of the present invention is provided with the first tie bars 7 near the inner leads 4 and the second tie bars 8 near the ends 5b of the outer leads, it is possible to prevent the resin 15 and the resin 13 from flowing to the outer leads 5 at the time of the sealing, resulting in high-precision sealing.

Figure 4:
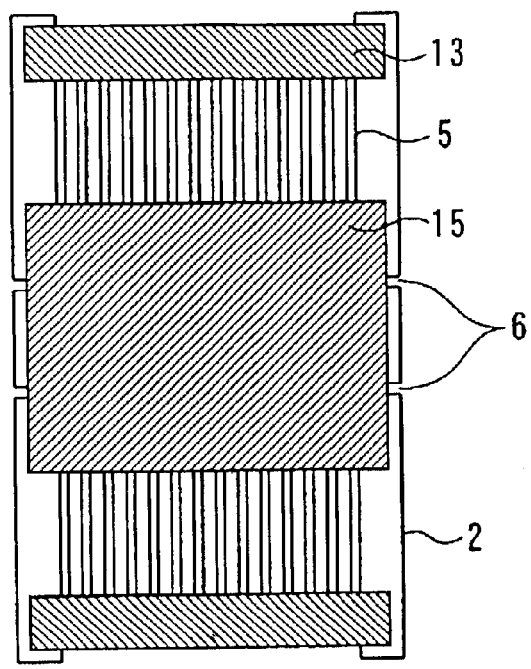
FIG. 4 is a plane view of a semiconductor device using a lead frame in an inspection according to the present invention.

Then, the first tie bars 7 and the second tie bars 8 are cut as shown in FIG. 4. This electrically isolates each outer lead 5. However, since other (connection) portions are not cut, each device 19 is still attached to the lead frame 21, as shown in FIG. 3. In this state, the electrical properties of each device 19 are inspected before cutting off the suspension leads 6 shown in FIG. 1. Furthermore, the lead supports 9 are cut from the framework 2. The above process removes each device 19 from the lead frame 21 as a separate unit.

Figure 5:
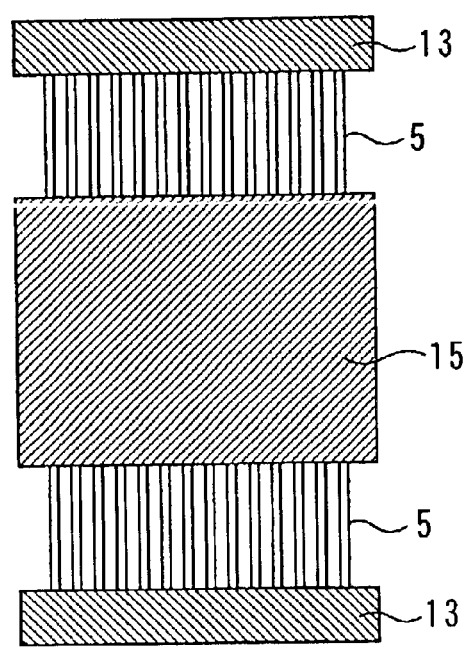
FIG. 5 is a plane view of a device cutting off a lead frame according to the present invention.
Figure 6:
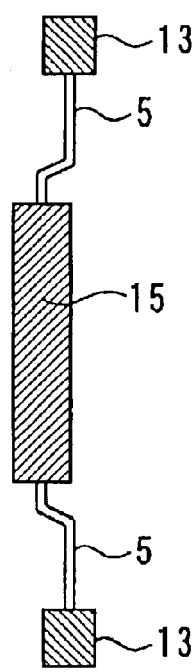
FIG. 6 is a side view of a device according to the present invention after it is bent.

Thus, to remove each device from the lead frame, the present invention characteristically cuts the lead supports from the lead frame instead of cutting the outer leads. Therefore, as shown in FIG. 5, in each separated individual device, the lead supports are still connected to the ends of the outer leads 5 through the resin 13. In this state, the outer leads 5 are bent in a predetermined shape. Since the outer leads 5 are supported and fixed by the lead supports, the bending work can be stable. For example, the width of each outer lead must be set narrower as the pitch of the outer leads becomes narrower. For this reason, the outer leads have a cross section whose horizontal sides (that is, the sides in the direction of the width of the leads) are shorter than the vertical sides. Therefore, the outer leads are likely to be deformed (bent) in the horizontal direction when they are bent in a predetermined shape. According to the present invention, however, since the outer leads are bent in a state in which they are supported and fixed by the lead supports, it is possible to bend the outer leads in a desired shape without causing the above deformation. FIG. 6 is a side view of a device according to the present invention after it is bent.

Figure 7A:
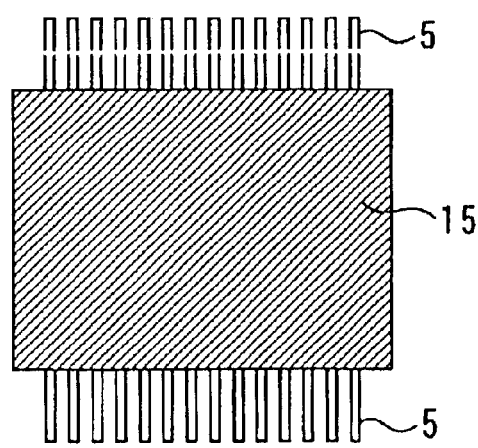
FIG. 7A is a plane view of a semiconductor device according to the present invention.
Figure 7B:
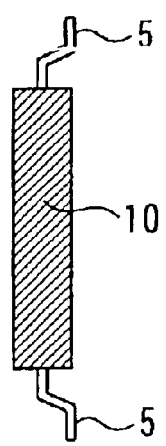
FIG. 7B is a side view a semiconductor device according to the present invention.

Then, in FIG. 6, the outer leads 5 are cut to remove the lead supports together with the resin 13, completing the production of the resin-sealed semiconductor device. FIG. 7(*a*) is a plane view of a completed semiconductor device according to the present embodiment, while FIG. 7(*b*) is a side view.

Description will be made below of a method for inspecting the electrical properties of a device using a lead frame according to the present invention. As shown in FIG. 3, after cutting the first and second tie bars to electrically isolate each outer lead, the inspecting aid indicated by line A and line A' are set in parallel with the direction in which the outer leads 20 of each device 19 are disposed alongside of one another (that is, perpendicular to the direction in which the outer leads 20 extend). As a result, the electrode terminals (not shown) attached to each inspecting aid are disposed alongside of one another in a direction parallel to the direction in which the outer leads 20 are disposed. Furthermore, since a measuring device (not shown) is already connected to each inspecting aid, the electrical properties of each device 19 can be inspected by connecting the electrode terminals attached to each inspecting aid to the outer leads 20.

Figure 8:
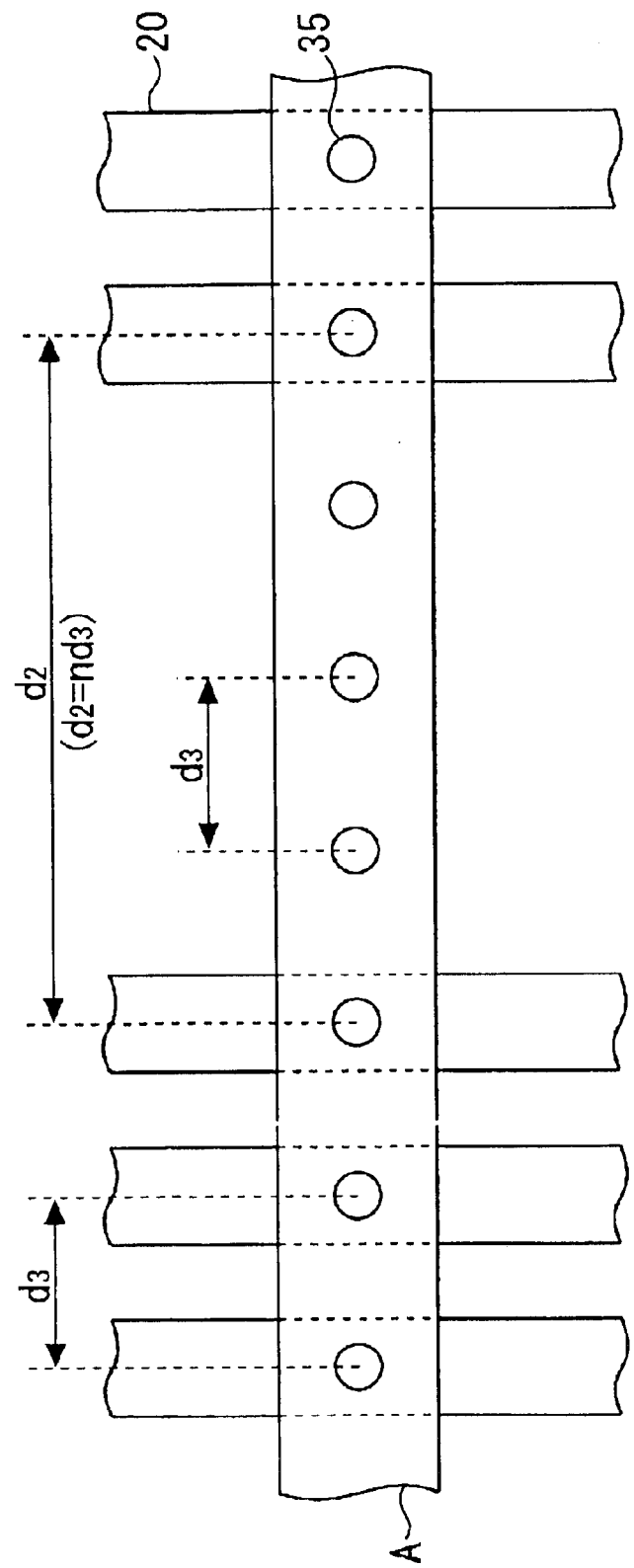
FIG. 8 shows a method for inspecting electrical properties according to the present invention.
Figure 9:
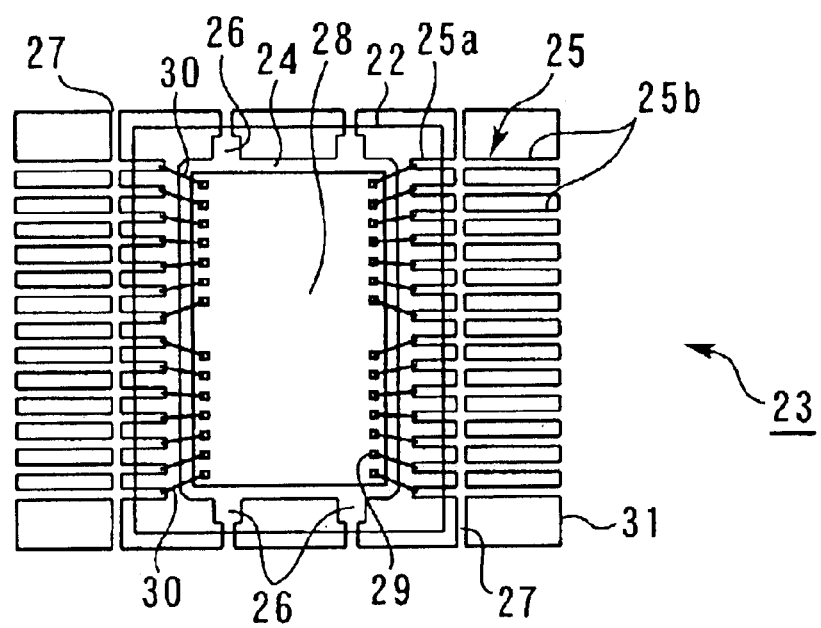
FIG. 9 is a perspective plane view of a semiconductor device using a conventional lead frame.
Figure 11A:
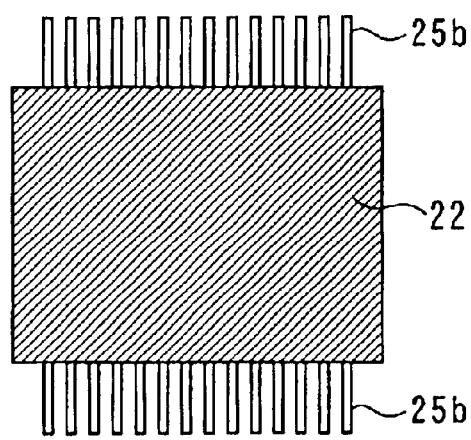
FIG. 11A is a plane view of a conventional semiconductor device.
Figure 11B:
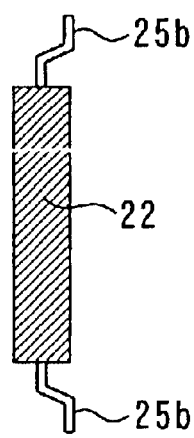
FIG. 11B is a side view a conventional semiconductor device.

FIG. 8 is an enlarged plane view of the inspecting aid indicated by line A and (corresponding) lead portions shown in FIG. 3. Electrode terminals 35 are disposed, for example, at the same pitch ($d_3$) as that of the outer leads of each device. Furthermore, the distance $d_2$ between the close-set outer leads of each two neighboring devices is set to n times the pitch $d_3$ of the outer leads of each device, where n is an integer. With this arrangement, bringing one electrode terminal into contact with the corresponding outer lead of the corresponding device automatically causes all electrode terminals to come into contact with the corresponding outer leads for each device without any misalignment. Therefore, it is possible to inspect the electrical properties of each device in a state in which the device is mounted on the lead frame forming a single unit, which can considerably reduce the time required for the inspection. Furthermore, each device (which is a small individual semiconductor device) need not be separately inspected (by removing it from the lead frame), solving the problem that the device might drop from the inspecting aid when its package size is small.

It should be noted that the same inspecting aid may be used to check the electrical properties of any device if the device has its outer leads disposed at a pitch n times the pitch of the electrode terminals, where n is an integer. In other words, for a lead frame in which the distance between the close-set outer leads of each two neighboring devices is set to $N_1$ times the pitch of the outer leads of each device, it is possible to use an inspecting aid whose electrode terminals have a pitch $1/N_2$ times the pitch of the outer leads of each device, where $N_1$ and $N_2$ are integers.

For example, an inspecting aid having electrode terminals disposed at a pitch of 0.4 mm can be applied to devices whose outer leads are disposed at a pitch of not only 0.4 mm ($N_2=1$) but also 0.8 mm ($N_2=2$). It should be noted that in this case, the distance between the close-set outer leads of each two neighboring devices is ($0.4 \times N_1$) times or ($0.8 \times N_1$) times, respectively. Thus, the inspecting aid may not need to be changed to inspect devices having different pin counts, package sizes, package thicknesses, etc.

Further, as shown in FIG. 1, the package sealed with the resin 10 is supported by the suspension leads 6 as well as by the lead supports 9 through the outer leads 5 and the resin 13. The suspension leads generally have a narrow width so as to reduce the damage to the package (breakage of the resin, etc.) caused when the suspension leads are removed from the frame in a post-process. Therefore, if the package is supported by only the suspension leads, deformation or breakage of the suspension leads might occur during the (manufacturing) process. If deformation or breakage of a suspension lead occurs, the package is displaced from its predetermined position, thereby displacing the outer leads from their predetermined positions. This makes it difficult to bring the outer leads into contact with the electrode terminals of the inspecting aid, preventing the inspection from being properly carried out. According to the present invention, however, since the package is also supported by the lead supports, the possibility of deformation or breakage of the suspension leads is low. In addition, even when a suspension lead has been deformed or broken, the package and its outer leads are not displaced from their predetermined positions since the lead supports are holding the outer leads and the package, resulting in proper inspection.

Still further, since the outer leads are supported and fixed by the lead supports, the outer leads are not deformed when they are brought into contact with the electrode terminals, also resulting in proper inspection.

It should be noted that the above description of the present invention uses expressions such as "n times . . . , where n is an integer" and "m times . . . , where m is an integer". However, in practical application of the present invention, these expressions are to be read as "substantially n times . . . , where n is an integer" and "substantially m times . . . , where m is an integer" since mathematically exact integer multiples are not required. For example, when the outer leads of each device are disposed at a pitch of 0.4 mm, the inspecting aid to be employed need not have their electrode terminals arranged at a pitch of exactly 0.4 mm. The electrode terminals may be allowed to have a pitch a little longer or a little shorter than 0.4 mm if no problem arises in the measurement. This principle is also applied to the distance between the close-set outer leads of each two neighboring devices.

The present embodiment described above is applied to cases in which each device is disposed in a single row in the longitudinal direction of the lead frame. However, the present invention is not limited to this specific arrangement.

For example, the present invention can be applied to an arrangement in which a plurality of rows of devices are added to the arrangement shown in FIG. 2, each row is disposed above or below the row of FIG. 2 in parallel with one another.

Further, the present embodiment described above is applied to semiconductor devices employing an SOP type package. However, the present invention is not limited to this specific type of semiconductor device. The present invention can be applied to semiconductor devices employing a TSOP (Thin Small Outline Package) type package.

The features and advantages of the present invention may be summarized as follows.

According to one aspect, it is possible to inspect the electrical properties of a device in a state in which it is mounted on the lead frame forming a single unit. Furthermore, in the lead frame, since the lead supports support the package and the outer leads, the deformation of the suspension leads and the outer leads can be reduced.

According to another aspect, it is possible to considerably reduce the time required for inspection as well as solving the problem that the semiconductor device might drop from the inspecting aid, resulting in enhanced productivity. Furthermore, the same inspecting aid can be used to inspect devices having different pin counts, etc., resulting in reduced production cost.

According to other aspect, it is possible to inspect the electrical properties (of each device) in a state in which it is mounted on the lead frame forming a single unit, considerably reducing the time required for inspection. Furthermore, the same inspecting aid can be used to inspect devices having different pin counts, etc.

Obviously many modifications and variations of the present invention are possible in the light oh the above teachings. It is therefore to be understood that within the scope of the appended claims the invention may by practiced otherwise than as specifically described.

The entire disclosure of a Japanese Patent Application No. 2002-217694, filed on Jul. 26, 2002 including specification, claims, drawings and summary, on which the Convention priority of the present application is based, are incorporated herein by reference in its entirety.

What is claimed is:

1. A lead frame comprising a plurality of framework assemblies, each framework assembly including:

a framework;

a suspension lead whose both ends are connected to said framework;

a die pad which is supported by said suspension lead and on which a semiconductor chip is mounted;

a plurality of inner leads whose front ends are connected to electrodes on said semiconductor chip through wires;

a plurality of outer leads extending from back ends of said plurality of inner leads toward outside of said semiconductor chip, wherein front ends of said plurality of outer leads are connected to no other portions and leave in a free state;

a first tie bar located near said plurality of inner leads across said plurality of outer leads, wherein both ends of said first tie bar are connected to said framework;

a second tie bar located near said front ends of said plurality outer leads across said plurality of outer leads, wherein both ends of said second tie bar are connected to said framework; and a lead support protruding from said framework's surface facing to said front ends of said plurality of outer leads to said front ends of them and having a rectangular shape whose long sides are in parallel with a direction in which said plurality of outer leads are disposed alongside of one another and whose length is approximately equal to a length of space occupied by all of said plurality of outer leads;

wherein said plurality of framework assemblies are disposed alongside of one another in a direction perpendicular to a direction in which said plurality of outer leads extend; and wherein a distance between close-set outer leads of each two neighboring frameworks is substantially n times a pitch of said plurality of outer leads of each framework, wherein n is an integer.

* * * * *